United States Patent
Lin et al.

(10) Patent No.: US 9,373,675 B2
(45) Date of Patent: Jun. 21, 2016

(54) CAPACITOR STRUCTURE AND METHOD OF FORMING THE SAME

(75) Inventors: Tai-Chun Lin, Tainan (TW); Wen-Tsao Chen, Tainan (TW); Chih-Ho Tai, Tainan (TW); Ming-Ray Mao, Tainan (TW); Kuan-Chi Tsai, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 580 days.

(21) Appl. No.: 13/367,064

(22) Filed: Feb. 6, 2012

(65) Prior Publication Data

US 2013/0200490 A1  Aug. 8, 2013

(51) Int. Cl.
| | |
|---|---|
| *H01L 29/92* | (2006.01) |
| *H01L 49/02* | (2006.01) |
| *H01L 21/3105* | (2006.01) |
| *H01L 21/02* | (2006.01) |

(52) U.S. Cl.
CPC ............ *H01L 28/40* (2013.01); *H01L 21/3105* (2013.01); *H01L 21/0217* (2013.01); *H01L 21/02164* (2013.01)

(58) Field of Classification Search
CPC ............... Y10S 438/957; H01L 28/60; H01L 21/31604
USPC ................ 427/579; 438/197, 240, 239, 791; 117/104; 257/E21.01, E21.274, 257/E21.018, E21.008, 308
See application file for complete search history.

(56) References Cited

U.S. PATENT DOCUMENTS

| | | | | |
|---|---|---|---|---|
| 5,981,404 | A * | 11/1999 | Sheng ............... | H01L 21/28202 257/E21.269 |
| 6,350,707 | B1 * | 2/2002 | Liu et al. ......................... | 438/791 |
| 8,076,250 | B1 * | 12/2011 | Rajagopalan ..... | H01L 21/02164 257/288 |

(Continued)

FOREIGN PATENT DOCUMENTS

| | | |
|---|---|---|
| CN | 1512562 A | 7/2004 |
| CN | 101123189 A | 2/2008 |

(Continued)

OTHER PUBLICATIONS

C.H. Ng et al., "Effect of Nitrous Oxide Plasma Treatment on the MIM Capacitor," IEEE Electron Device Letters, vol. 23, No. 9, Sep. 2002, pp. 529-531.*

(Continued)

*Primary Examiner* — Kenneth Parker
*Assistant Examiner* — Bo Fan
(74) *Attorney, Agent, or Firm* — Slater Matsil, LLP

(57) ABSTRACT

Disclosed embodiments include a capacitor structure and a method for forming a capacitor structure. An embodiment is a structure comprising a conductor-insulator-conductor capacitor on a substrate. The conductor-insulator-conductor capacitor comprises a first conductor on the substrate, a dielectric stack over the first conductor, and a second conductor over the dielectric stack. The dielectric stack comprises a first nitride layer, a first oxide layer over the first nitride layer, and a second nitride layer over the first oxide layer. A further embodiment is a method comprising forming a first conductor on a substrate; forming a first nitride layer over the first conductor; treating the first nitride layer with a first nitrous oxide ($N_2O$) treatment to form an oxide layer on the first nitride layer; forming a second nitride layer over the oxide layer; and forming a second conductor over the second nitride layer.

20 Claims, 5 Drawing Sheets

(56) References Cited

U.S. PATENT DOCUMENTS

| | | |
|---|---|---|
| 2003/0096473 A1* | 5/2003 | Shih et al. .................... 438/240 |
| 2004/0126964 A1 | 7/2004 | Park et al. |
| 2004/0129204 A1* | 7/2004 | Sandhu et al. ................ 117/104 |
| 2007/0052012 A1 | 3/2007 | Forbes |
| 2007/0202656 A1* | 8/2007 | Park et al. .................... 438/393 |
| 2009/0324851 A1* | 12/2009 | Shih et al. .................... 427/579 |
| 2011/0018056 A1 | 1/2011 | Takeuchi |
| 2012/0049252 A1 | 3/2012 | Masuoka et al. |
| 2012/0264265 A1 | 10/2012 | Masuoka et al. |

FOREIGN PATENT DOCUMENTS

| | | |
|---|---|---|
| CN | 101847636 A | 9/2010 |
| CN | 101866857 A | 10/2010 |
| CN | 101933149 A | 12/2010 |

OTHER PUBLICATIONS

Ng. et al., "Effect of Nitrous Oxide Plasma Treatment on MIM Capacitor," IEEE Electron Device Letters, vol. 23, No. 9, Sep. 2002, pp. 529-531.*

* cited by examiner

CAPACITOR STRUCTURE AND METHOD OF FORMING THE SAME

BACKGROUND

Many kinds of capacitors such as metal-oxide-semiconductor (MOS) capacitors, PN junction capacitors, polysilicon-insulator-polysilicon (PIP) capacitors, and metal-insulator-metal (MIM) capacitors are used in semiconductor devices. In particular, the MIM capacitor offers reduced electrode resistance with a wide range of applications.

MIM capacitors have been widely used in functional circuits such as mixed signal circuits, analog circuits, radio frequency (RF) circuits, dynamic random access memory (DRAM), embedded DRAM, and logic operation circuits. In system-on-chip applications, different capacitors for different functional circuits have to be integrated on a same chip to serve different purposes. For example, in mixed signal circuits, capacitors are used as decoupling capacitors and high-frequency noise filters. For DRAM and embedded DRAM circuits, capacitors are used for memory storage; while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

With the capacitors having different functions formed in different metal layers, the capacitors may work under different operation voltages. For example, when used as decoupling capacitors, the capacitors need to be able to sustain high voltages. Therefore, the capacitor insulators need to be thick. In DRAMs, on the other hand, the operation voltage is low, and the capacitors need to be small in order to increase the DRAM cell density. Therefore, the capacitor insulators need to be thin.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a metal-insulator-metal (MIM) capacitor. Other embodiments may also be applied, however, to other capacitors, such as a polysilicon-insulator-polysilicon (PIP) capacitor and others. Applications of concepts disclosed herein include, among others, high voltage applications, voltage decoupling applications, radio frequency (RF) applications, and dynamic random access memory (DRAM) applications.

Figure 1:
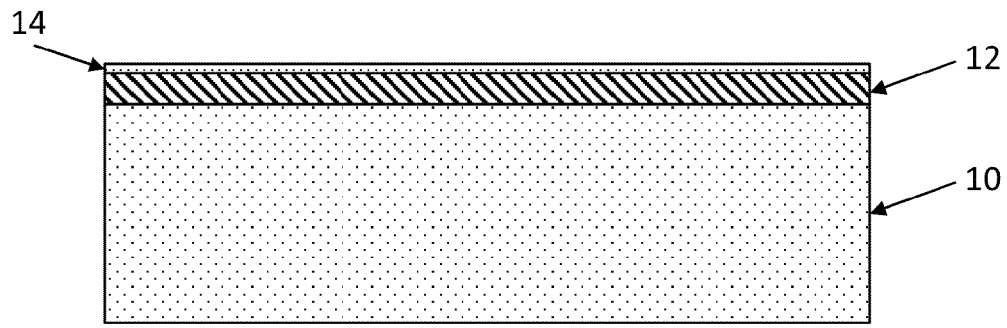
FIGS. 1 through 7 are a method of forming a metal-insulator-metal (MIM) capacitor according to an embodiment.

In FIG. 1, a capacitor bottom metal 12 is formed over a substrate 10. The substrate 10, in an embodiment, is a semiconductor substrate like silicon with various dielectric layers and/or metallization layers formed over the semiconductor substrate. The substrate 10 can be other structures, such as a semiconductor on insulator (SOI), other semiconductor substrates, organic substrates, or the like, and may comprise other materials and/or structures. The capacitor bottom metal 12, in an embodiment, comprises a bottom barrier layer of titanium nitride (TiN), a layer of aluminum copper (AlCu) over the bottom barrier layer, and a top barrier layer of TiN over the layer of AlCu. In other embodiments, the capacitor bottom metal 12 comprises aluminum, copper, titanium, tantalum, tungsten, the like, or a combination thereof, with or without a barrier layer, such as tantalum nitride, tungsten nitride, the like, or a combination thereof, formed thereover. The capacitor bottom metal 12 can be formed by acceptable deposition processes, such as a chemical vapor deposition (CVD), a physical vapor deposition (PVD), the like, or a combination thereof.

In an embodiment, the capacitor bottom metal 12 is treated with a plasma nitrous oxide ($N_2O$) treatment after the capacitor bottom metal 12 is formed. The $N_2O$ treatment can form a thin dielectric layer 14 on the capacitor bottom metal 12. In an embodiment, such as when the capacitor bottom metal 12 includes a TiN barrier layer, the $N_2O$ treatment forms a titanium oxide ($TiO_2$) as the thin dielectric layer 14. In other embodiments, the thin dielectric layer 14 can comprise tantalum oxide ($Ta_2O_5$), or the like. The thin dielectric layer 14 can have a thickness between approximately 10 angstroms (Å) and approximately 40 Å. The nitrous oxide treatment can increase the smoothness of the capacitor bottom metal 12 and can increase the adhesion of subsequently formed layers.

Figure 2:
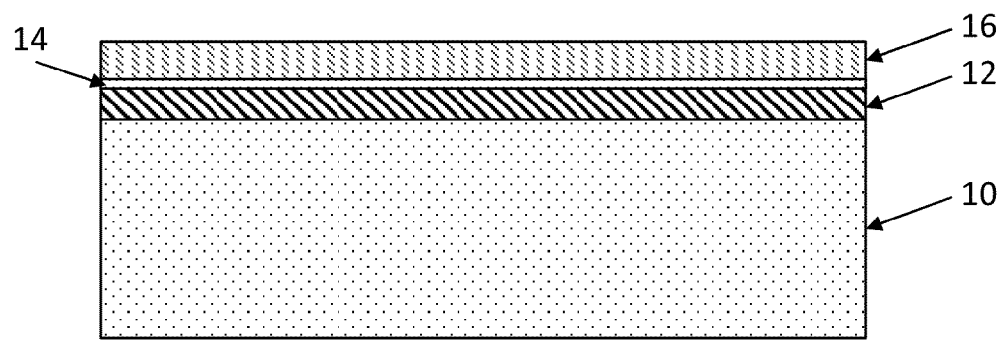

In FIG. 2, a first dielectric layer 16 is deposited over the capacitor bottom metal 12. In an embodiment, the first dielectric layer 16 comprises silicon nitride. In other embodiments, the first dielectric layer 16 can comprise silicon oxide or the like. The first dielectric layer 16 can be deposited using an acceptable deposition process, such as CVD, a furnace deposition, the like, or a combination thereof. In an embodiment where the MIM is to have a capacitance of 2.0 fF, the first dielectric layer 16 can have a thickness, for example, between approximately 140 Å and approximately 160 Å after deposition. As a person having ordinary skill in the art will readily understand, the capacitance of the MIM structure depends in part on the thickness of the dielectric layers.

Figure 3:
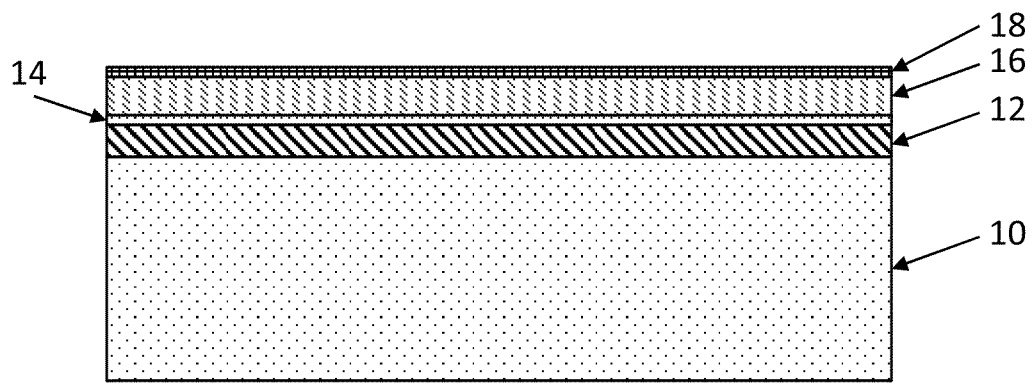

In FIG. 3, the first dielectric layer 16 is treated with a plasma $N_2O$ treatment, which forms a second dielectric layer 18. In an embodiment, the $N_2O$ treatment forms an oxide layer, such as a silicon oxide ($SiO_2$), as the second dielectric layer 18. The $N_2O$ treatment is similar to or the same as described with respect to FIG. 1. After the treatment, the first dielectric layer 16 can have a thickness, for example, between approximately 90 Å and approximately 120 Å, and the second dielectric layer 18 can have a thickness, for example, between approximately 15 Å and approximately 30 Å. The silicon oxide of the second dielectric layer 18 generally has a higher bandgap energy than silicon nitride. A thin layer of the silicon oxide interposed between layers of silicon nitride, as will be shown in further detail below, can increase the breakdown voltage of the MIM without significantly affecting the thickness (due to a difference in permittivity of the materials) for a given capacitance value. Embodiments contemplate various materials where a material, such as with as a thin layer, with a higher bandgap energy is interposed between layers of different materials.

Figure 4:
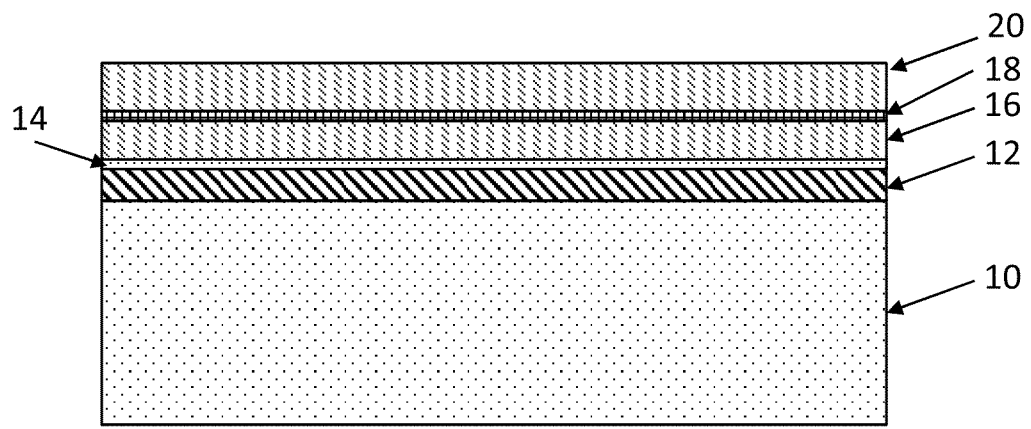

In FIG. 4, a third dielectric layer 20 is deposited over the second dielectric layer 18. In an embodiment, the third dielectric layer 20 comprises silicon nitride. In other embodiments, the third dielectric layer 20 can comprise silicon oxide or the like. The third dielectric layer 20 can be deposited using an acceptable deposition process, such as CVD, a furnace deposition, the like, or a combination thereof. The third dielectric layer 20 can have a thickness, for example, between approximately 140 Å and approximately 160 Å after deposition, such as when the MIM capacitor has a capacitance of 2.0 fF. Other embodiments contemplate different thicknesses for different capacitance values.

Figure 5:
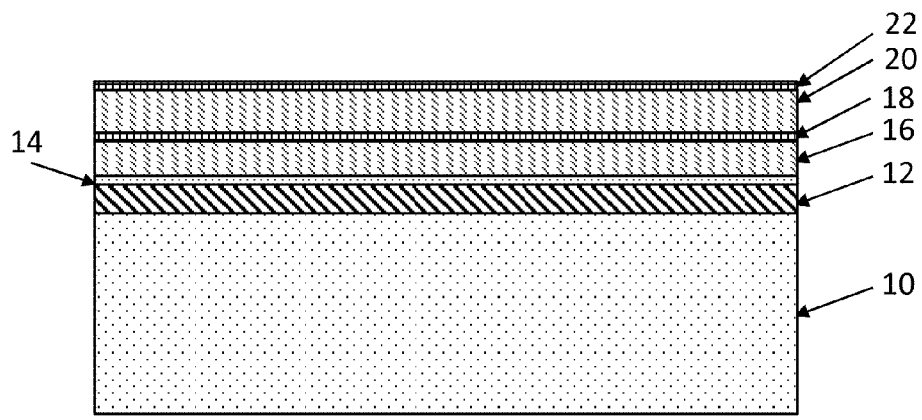

In FIG. 5, the third dielectric layer 20 is treated with a plasma $N_2O$ treatment, which forms a fourth dielectric layer 22. In an embodiment, the $N_2O$ treatment forms an oxide layer, such as a silicon oxide ($SiO_2$), as the fourth dielectric layer 22. The $N_2O$ treatment is similar to or the same as described with respect to FIG. 1. After the treatment, the third dielectric layer 20 can have a thickness, for example, between approximately 90 Å and approximately 120 Å, and the fourth dielectric layer 22 can have a thickness, for example, between approximately 15 Å and approximately 30 Å.

Figure 6:
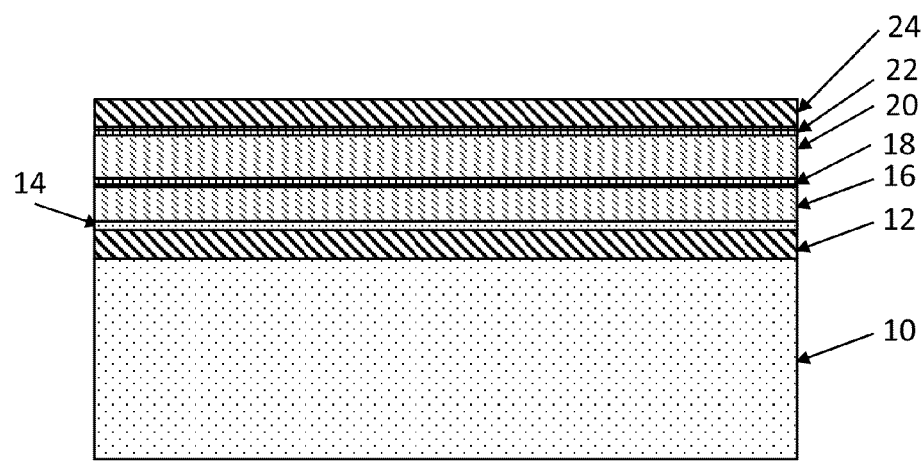

In FIG. 6, a capacitor top metal 24 is formed over the fourth dielectric layer 22. The capacitor top metal 24, in an embodiment, comprises layer of AlCu with a barrier layer of TiN formed thereover. In other embodiments, the capacitor top metal 24 comprises aluminum, copper, titanium, tantalum, tungsten, the like, or a combination thereof, with or without a barrier layer, such as tantalum nitride, tungsten nitride, the like, or a combination thereof. The capacitor top metal 24 can be formed by acceptable deposition processes, such as a CVD, PVD, the like, or a combination thereof.

Figure 7:
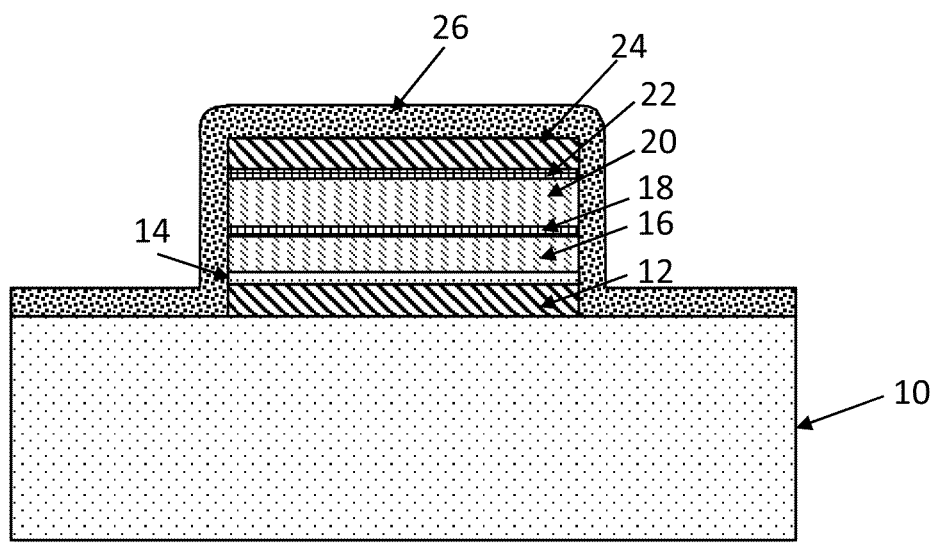

In FIG. 7, the various metals 12 and 24 and dielectric layers 14, 16, 18, 20, and 22 are patterned to form a MIM capacitor. The patterning may be by an acceptable photolithography process and may include multiple etching steps. For example, a hardmask layer can be deposited over the capacitor top metal 24 and patterned into a hardmask using a photoresist and etching. An etch using the hardmask can pattern one or more of the various layers. Due to etch selectivity of the various materials, for example, multiple etch steps and multiple hardmasks may be used in patterning the MIM capacitor. After the MIM capacitor is patterned, a dielectric layer 26, such as a contact etch stop layer (CESL) like a silicon nitride, or a silicon oxide, such as one with a low deposition rate of approximately 640 Å per minute, for example, is conformally formed along sidewalls and a top surface of the MIM capacitor. Other layers, such as dielectric and metallization layers, can be formed over the MIM capacitor.

It should be noted that other configurations of a MIM capacitor are contemplated within the scope of embodiments, and FIG. 7 is an example of a MIM capacitor. For example, the MIM capacitor can have layers that are not all co-extensive, and any layer can extend further from the center of the MIM than an overlying layer. For example, the capacitor bottom metal 12 can extend further than the dielectric layers 16, 18, 20, and 22, and the dielectric layers 16, 18, 20, and 22 can extend further than the capacitor top metal 24. Further, a MIM capacitor can be formed in a cup configuration where a substrate, such as a dielectric layer, is etched to form a recess, and the various layers are conformally formed within the recess. Excess materials of the layers can then be removed, for example, by a chemical mechanical polish (CMP).

Embodiments may achieve higher breakdown voltages than known MIM capacitors. The inventors of the present disclosure have discovered that by treating the various surfaces of a MIM capacitor as discussed above, pin holes between the capacitor top and bottom metals can be minimized, thereby reducing leakage paths. This can increase the reliability of a MIM capacitor and can achieve higher break down voltages.

Figure 8:
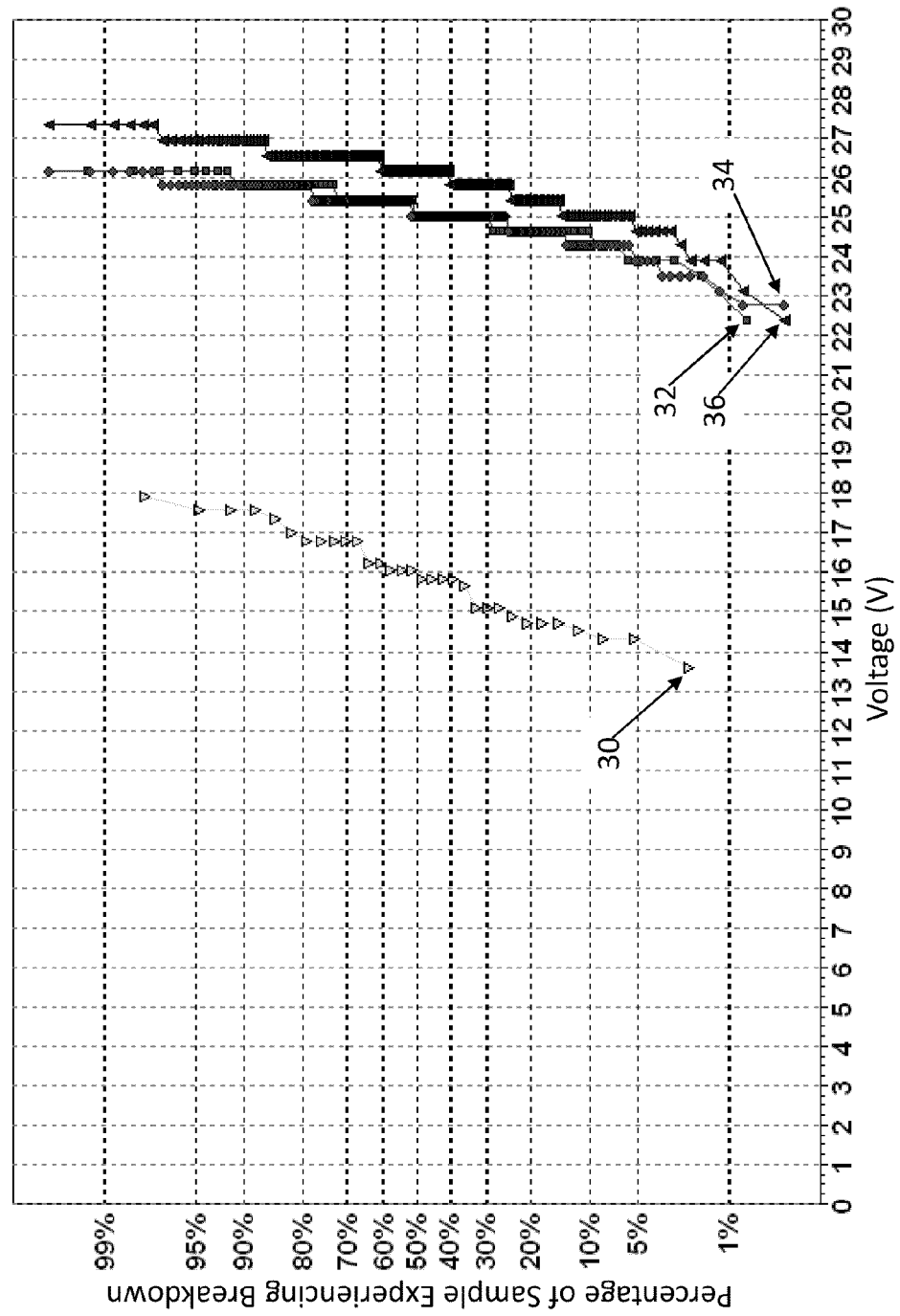
FIG. 8 is a chart comparing breakdown voltages of samples of a known MIM capacitor and embodiments of MIM capacitors disclosed herein.

FIG. 8 is a chart comparing the percentages of samples of MIM capacitors that breakdown at a given voltage. In FIG. 8, points 30 illustrate the percentage of capacitors having a known structure experiencing breakdown at a given voltage, where the sample size is 32 capacitors formed on a wafer. Points 32, 34, and 36 illustrate percentages of capacitors according to embodiments experiencing breakdown at a given voltage. Points 32 have a sample size of 96 capacitors formed on a wafer, where the $N_2O$ treatment was applied for 15 seconds. Points 34 have a sample size of 224 capacitors formed on a wafer, where the $N_2O$ treatment was applied for 5 seconds. Points 36 have a sample size of 224 capacitors formed on a wafer, where the $N_2O$ treatment was applied for 25 seconds. The capacitors in this experiment have silicon nitride, silicon oxide, silicon nitride, silicon oxide as the first dielectric layer 16, second dielectric layer 18, third dielectric layer 20, and fourth dielectric layer 22, respectively, with the second dielectric layer 18 and the fourth dielectric layer 22 being formed by a $N_2O$ plasma treatment, as discussed above. Each of the capacitors is 2.0 femtofarads (fF). As seen from FIG. 8, a breakdown voltage can be increased from approximately 16V to approximately 25V, which is an increase of greater than 50 percent.

An embodiment is a structure comprising a first conductor on a substrate, a first nitride layer over the first conductor, a first oxide layer over the first nitride layer, a second nitride layer over the first oxide layer, and a second conductor over the second nitride layer.

Another embodiment is a structure comprising a conductor-insulator-conductor capacitor on a substrate. The conductor-insulator-conductor capacitor comprises a first conductor on the substrate, a dielectric stack over the first conductor, and a second conductor over the dielectric stack. The dielectric stack comprises a first nitride layer, a first oxide layer over the first nitride layer, and a second nitride layer over the first oxide layer.

Another embodiment is a comprising a first conductor on a substrate, a dielectric stack on the first conductor, and a second conductor on the dielectric stack. The dielectric stack comprises alternating nitride and oxide layers. The dielectric stack comprise at least one nitride layer and at least one oxide layer, and the alternating nitride and oxide layers alternate in a direction from the first conductor towards the second conductor.

A further embodiment is a method comprising forming a first conductor on a substrate; forming a first nitride layer over the first conductor; treating the first nitride layer with a first nitrous oxide ($N_2O$) treatment to form a first oxide layer on the first nitride layer; forming a second nitride layer over the first oxide layer; and forming a second conductor over the second nitride layer.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming a first conductor on a substrate;
forming a barrier layer comprising a metal on the first conductor;
treating the barrier layer with a first treatment consisting of nitrous oxide ($N_2O$) to form a thin oxide layer on the barrier layer, the thin oxide layer comprising a portion of the metal of the barrier layer;
forming a first nitride layer having a first thickness on the thin oxide layer;
treating the first nitride layer with a second treatment consisting of $N_2O$ to form a first oxide layer on the first nitride layer, the first nitride layer having a second thickness less than the first thickness after treating the first nitride layer with the second treatment;
forming a second nitride layer having a third thickness on the first oxide layer;
treating the second nitride layer with a third treatment consisting of $N_2O$ to form a second oxide layer on the second nitride layer, the second nitride layer having a fourth thickness less than the third thickness after treating the second nitride layer with the third treatment; and
forming a second conductor on the second oxide layer.

2. The method of claim 1, wherein each of the first treatment, the second treatment, and the third treatment is a plasma treatment.

3. The method of claim 1, wherein the first nitride layer and the second nitride layer comprise silicon nitride (SiN), and the first oxide layer comprises silicon oxide (SiO).

4. The method of claim 1, wherein the first conductor comprises aluminum copper (AlCu) and the barrier layer is over the aluminum copper, the barrier layer comprising titanium nitride (TiN), the thin oxide layer being on the barrier layer, the thin oxide layer consisting of titanium oxide ($TiO_2$).

5. The method of claim 1, further comprising forming a contact etch stop layer over the second conductor.

6. A method comprising:
depositing a first conductive layer over a substrate, the first conductive layer comprising a barrier layer comprising a metal;
treating the first conductive layer with a treatment consisting of a first single treatment gas, the first single treatment gas being nitrous oxide ($N_2O$), to form a thin oxide layer comprising the metal of the barrier layer over the first conductive layer;
depositing a first nitride layer over the thin oxide layer;
treating the first nitride layer with a second single treatment gas, the second single treatment gas being $N_2O$, to form a first oxide layer over the first nitride layer;
depositing a second nitride layer over the first oxide layer;
treating the second nitride layer with a third single treatment gas, the third single treatment gas being $N_2O$, to form a second oxide layer over the second nitride layer;
depositing a second conductive layer over the second oxide layer; and
etching the second conductive layer, the second oxide layer, the second nitride layer, the first oxide layer, the first nitride layer, the thin oxide layer, and the first conductive layer to form a conductive-insulator-conductive (CIC) capacitor, the CIC capacitor comprising respective portions of the second conductive layer, the second oxide layer, the second nitride layer, the first oxide layer, the first nitride layer, the thin oxide layer, and the first conductive layer.

7. The method of claim 6 further comprising forming an etch stop layer over the CIC capacitor.

8. The method of claim 6 wherein the treating the first conductive layer with $N_2O$ comprises increasing a smoothness of the first conductive layer after the depositing the first conductive layer.

9. The method of claim 6 wherein the treating the first conductive layer with $N_2O$ comprises increasing an adhesion of the first conductive layer to an immediately overlying and adjacent layer after the depositing the first conductive layer.

10. The method of claim 6, wherein each of the treating the first conductive layer with $N_2O$, the treating the first nitride layer with $N_2O$, and the treating the second nitride layer with $N_2O$ comprises using a plasma process.

11. A method comprising:
depositing a first conductive layer comprising a metal over a substrate;
exposing the first conductive layer to a first oxygen-containing plasma to form a thin metal oxide layer over the first conductive layer, the metal in the thin metal oxide layer being obtained from the metal of the first conductive layer during the exposing;
depositing a first nitride layer over the thin metal oxide layer;
exposing the first nitride layer to a second oxygen-containing plasma to form a first oxide layer over the first nitride layer, wherein the first nitride layer has a thickness from about 3 times to about 8 times the thickness of the first oxide layer;
depositing a second nitride layer over the first oxide layer;
exposing the second nitride layer to a third oxygen-containing plasma to form a second oxide layer over the second nitride layer, wherein the second nitride layer has a thickness from about 3 times to about 8 times the thickness of the second oxide layer;
wherein the first oxygen-containing plasma, the second oxygen-containing plasma, and the third oxygen-containing plasma each uses nitrous oxide ($N_2O$) as its sole treatment gas;
depositing a second conductive layer over the second oxide layer; and
forming a conductive-insulator-conductive (CIC) capacitor comprising respective portions of the second conductive layer, the second oxide layer, the second nitride layer, the first oxide layer, the first nitride layer, the thin metal oxide layer, and the first conductive layer.

12. The method of claim 11, wherein the first conductive layer comprises aluminum copper (AlCu).

13. The method of claim 11, wherein the first nitride layer and the second nitride layer comprise silicon nitride (SiN), and the first oxide layer and the second oxide layer comprise silicon oxide (SiO).

14. The method of claim 5, wherein the forming the contact etch stop layer further comprises conformally depositing the contact etch stop layer, the contact etch stop layer contacting a top surface and sidewalls of the second conductor, contacting sidewalls of the second oxide layer, the second nitride layer, the first oxide layer, the first nitride layer, the thin oxide layer, and the first conductor, and contacting a top surface of the substrate.

15. The method of claim 11 further comprising conformally depositing an etch stop layer on the CIC capacitor, the etch stop layer being in contact with a top surface and sidewalls of the second conductive layer, in contact with sidewalls of the second oxide layer, the second nitride layer, the first oxide layer, the first nitride layer, the thin metal oxide layer, and the first conductive layer, and in contact with a top surface of the substrate.

16. The method of claim 11, wherein the first nitride layer has a thickness from about 2.5 times to about 12 times the thickness of the thin metal oxide layer.

17. The method of claim 11, wherein the thin metal oxide layer comprises titanium oxide ($TiO_2$) or tantalum oxide ($Ta_2O_5$).

18. The method of claim 1, wherein the metal comprises at least one of titanium, tantalum, or tungsten.

19. The method of claim 1, wherein the thin oxide layer consists of titanium oxide ($TiO_2$).

20. The method of claim 1, wherein the first thickness is in a range from approximately 140 Å and approximately 160 Å, the second thickness is in a range from approximately 90 Å and approximately 120 Å, the third thickness is in a range from approximately 140 Å and approximately 160 Å, and the fourth thickness is in a range from approximately 90 Å and approximately 120 Å.

* * * * *